United States Patent [19]

Huber

[11] Patent Number: 5,295,209
[45] Date of Patent: Mar. 15, 1994

[54] SPONTANEOUS EMISSION SOURCE HAVING HIGH SPECTRAL DENSITY AT A DESIRED WAVELENGTH

[75] Inventor: David R. Huber, Warrington, Pa.

[73] Assignee: General Instrument Corporation, Hatboro, Pa.

[21] Appl. No.: 974,185

[22] Filed: Nov. 10, 1992

Related U.S. Application Data

[63] Continuation-in-part of Ser. No. 821,004, Jan. 15, 1992, Pat. No. 5,200,964, which is a continuation-in-part of Ser. No. 668,027, Mar. 12, 1991, Pat. No. 5,166,821.

[51] Int. Cl.$^5$ .............................................. G02B 6/34
[52] U.S. Cl. ........................................ 385/37; 372/26; 372/6; 385/31
[58] Field of Search ..................... 385/37, 1, 2, 3, 4, 385/8–10, 14, 23, 31; 372/26, 6, 19, 102

[56] References Cited

U.S. PATENT DOCUMENTS

| | | | |
|---|---|---|---|
| 4,039,249 | 8/1977 | Kaminow et al. | 385/10 X |
| 4,935,930 | 6/1990 | Handa | 385/14 X |
| 5,080,503 | 1/1992 | Najafi et al. | 385/1 |
| 5,134,620 | 7/1992 | Huber | 372/102 X |
| 5,142,660 | 8/1992 | Chang et al. | 385/10 |
| 5,200,964 | 4/1993 | Huber | 372/26 |
| 5,222,089 | 6/1993 | Huber | 372/6 |

OTHER PUBLICATIONS

P. Becker, et al., "Erbium-Doped Integrated Optical Amplifiers and Lasers in Lithium Niobate," *Optical Amplifiers and Their Applications*, 1992 Technical Digest Series, vol. 17, pp. THB-4, Jun. 24–26, 1992, Santa Fe, New Mexico.

T. Kitagawa, et al., "Amplification in Erbium-Doped Silica-Based Planar Lightwave Circuits," *Optical Amplifiers and Their Applications*, Postdeadline Papers, PD1, pp. 1–4, Jun. 24–26, 1992, Santa Fe, New Mexico.

*Primary Examiner*—John D. Lee
*Assistant Examiner*—Phan Thi Heartney
*Attorney, Agent, or Firm*—Barry R. Lipsitz

[57] ABSTRACT

A spontaneous emission source has a high spectral density at a desired wavelength. An integrated guided wave optical path is formed in either a semiconductor or silica substrate. An active medium and grating are provided within the optical path. The optical path is pumped to pass energy across the grating and active medium. The pump energy excites the active medium without lasing to output spontaneous emissions at a wavelength established by the grating. The source is particularly useful for reducing nonlinear effects in an optical fiber used for communicating AM or other information signals.

16 Claims, 7 Drawing Sheets

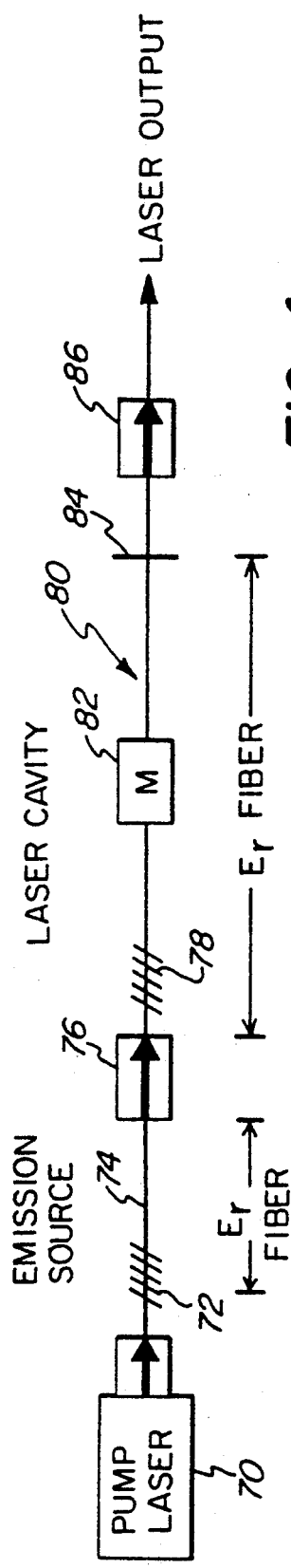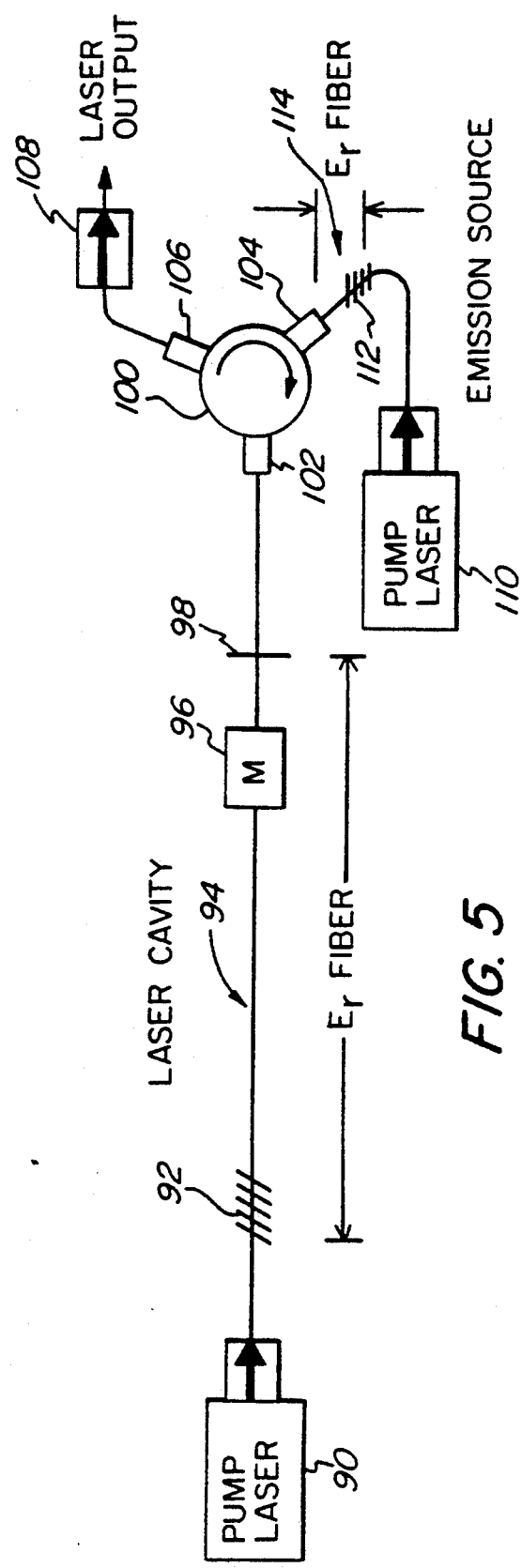

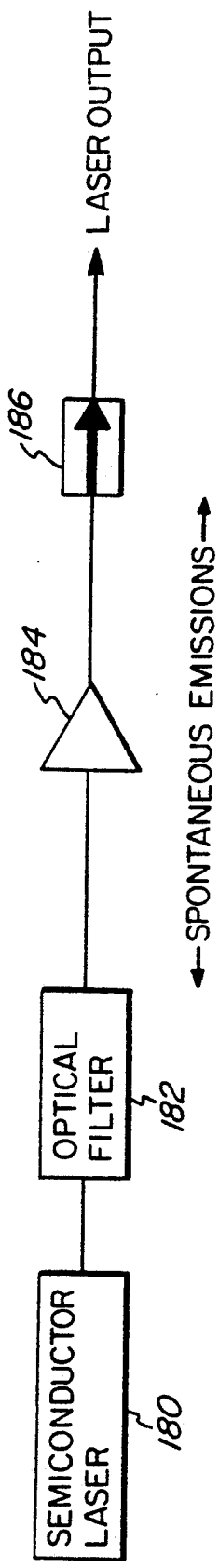
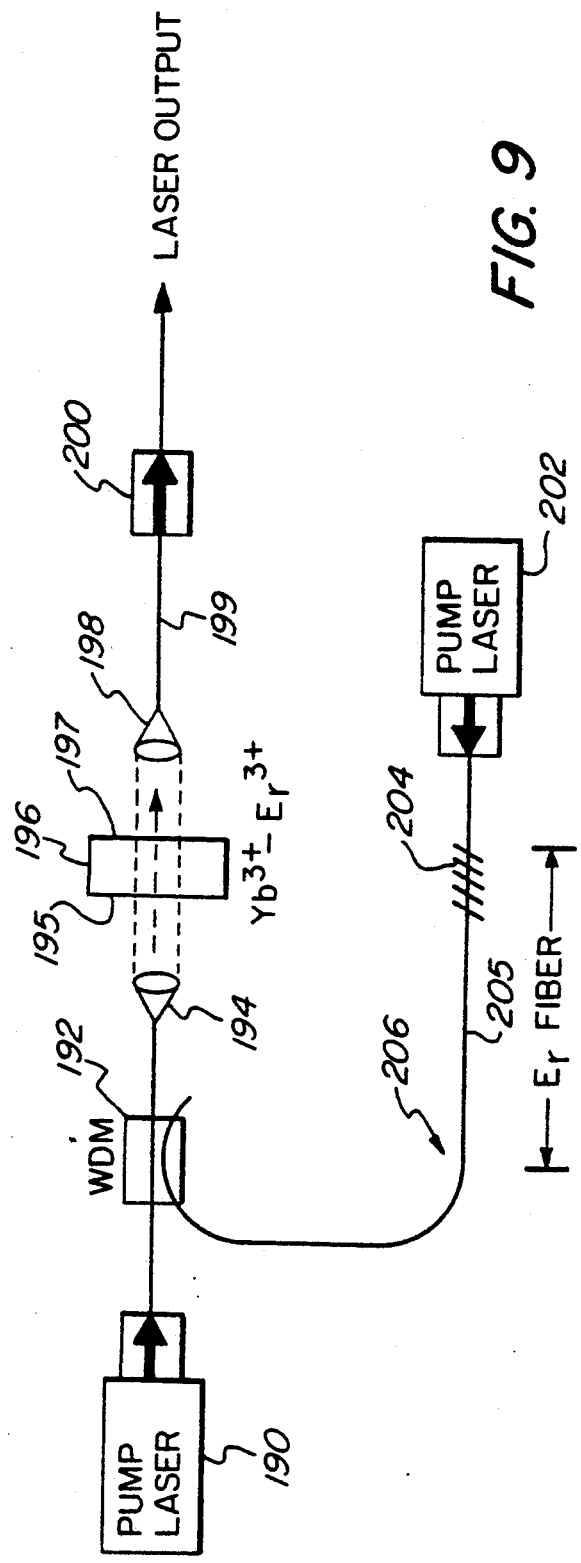
FIG. 8
FIG. 9

SPONTANEOUS EMISSION SOURCE HAVING HIGH SPECTRAL DENSITY AT A DESIRED WAVELENGTH

This application is a continuation-in-part of commonly assigned, co-pending U.S. patent application Ser. No. 07/821,004, filed Jan. 15, 1992, now U.S. Pat. No. 5,200,964 which was a continuation-in-part of commonly assigned, co-pending U.S. patent application Ser. No. 07/668,027, filed Mar. 12, 1991 now U.S. Pat. No. 5,166,821.

BACKGROUND OF THE INVENTION

The present invention relates to optical fiber communication systems, and more particularly to a spontaneous emission source that is useful, for example, in reducing non-linear effects in an optical fiber used for communicating AM or other information signals.

Optical transmission systems are currently being implemented for use in various communication applications. For example, telephone systems are now in use that utilize optical fiber technology to transmit voice and data signals over long distances. Similarly, cable television networks are available wherein optical fiber technology is used for the transmission of both analog and digital signals.

In order to transmit an information signal (e.g., a television signal) over an optical fiber, a light beam ("carrier") must be modulated with the information signal. The modulated carrier is then transmitted to a receiver via the optical fiber. At high power levels, silica fibers exhibit non-linear effects due to the interaction of the local electric field across the fiber and the fiber material. These non-linear effects also depend on the length of the fiber, with a cumulative degradation of performance resulting as the length of the fiber increases.

Among the non-linear effects exhibited in silica fibers at high power levels are four-wave mixing, Brillouin gain, and Raman gain. The magnitude of these interactions depend on the spectral density of the applied field. The power of the optical signal is also a factor in determining the severity of the non-linear effects.

Very little effect on signal transmission is seen below a threshold power density level. Beginning at a critical power density level, power will be shifted in wavelength by the non-linear interaction between the traveling wave and the material. Since optical fibers concentrate the power into a small cross section, the large fields required to make these effects significant arise at modest absolute power levels. For long distance signal transmission, these non-linear effects constitute an upper limit on the power level that can be transmitted. See, for example, Y. Aoki, K. Tajima and I. Mito, "Input Power Limits of Single-mode Optical Fiber Due to Simulated Brillouin Scattering in Optical Communications Systems," *IEEE Journal of Lightwave Technology*, May 1988, pp. 710–727 and Agrawal, Govind P., "Non-Linear Fiber Optics", Academic Press 1989, ISBN 0-12-045140-9. The non-linear effects in optical fibers are particularly troublesome for the transmission of amplitude modulated ("AM") signals, such as those used in conventional analog television signal broadcasting.

It would be advantageous to provide a method and apparatus for reducing the non-linear effects in optical fiber for the transmission of information signals, such as AM vestigial sideband (VSB-AM) television signals at high power levels. The present invention provides spontaneous emission sources that are useful, for example, in broadening the linewidth of lasers that output optical carriers. Such carriers can be used to communicate information signals via optical fiber links.

SUMMARY OF THE INVENTION

In accordance with the present invention, spontaneous emission sources are provided for reducing non-linear effects in an optical fiber used for communicating information signals, such as AM information signals, at high power levels. In the common terminology used by those skilled in the art of non-linear interactions, the terms "pump wavelength" and "signal wavelength" are used to describe the stimulated Brillouin interaction. Using this terminology, the signal laser in accordance with certain embodiments of the present invention plays the role of the pump laser. In such cases, the classical signal laser is absent since there is no desire to use the Brillouin gain, which gain would limit the achievable transmission distance and increase the system relative intensity noise from 0 Hz up to subcarriers a few times the Brillouin bandwidth.

In the present invention, a laser output signal is provided. The linewidth of the laser output signal is increased to provide a broadened optical signal. The optical signal is externally modulated with an information signal (e.g., an AM signal), and coupled to an optical link fiber for transmission to a receiver.

In order to increase the linewidth of a longitudinal mode of a laser, a laser cavity is provided for outputting an optical signal having a longitudinal mode. An active medium is pumped with a pump laser to provide a source of excess spontaneous emission at or near the lasing wavelength of the laser cavity. The laser cavity is pumped with the pump laser while excess spontaneous emission from the source thereof is injected into the laser cavity to increase the linewidth of said mode. In an illustrated embodiment, the laser cavity is pumped by energy received from the pump laser via the source of spontaneous emission.

A further embodiment of laser apparatus uses spontaneous emission to provide an optical carrier having a broad linewidth. A laser cavity outputs an optical signal having a longitudinal mode. An active medium having an output coupled to the laser cavity is provided for injecting spontaneous emission at or near the wavelength of said mode into the cavity. A pump laser is provided to pump the active medium for producing spontaneous emission while simultaneously pumping the laser cavity to produce the optical signal. In this manner, the spontaneous emission in the laser cavity increases the effective linewidth of said mode.

In an illustrated embodiment, the spontaneous emission is injected into the laser cavity together with the pumping energy for the laser cavity. The active medium can comprise a grating and a gain medium coupled in series with the laser cavity, for example, between the pump laser and the laser cavity.

In yet another embodiment, laser apparatus for providing an output signal with a broad linewidth comprises a laser cavity for outputting an optical signal to a first port of an optical circulator. Spontaneous emission means, having an output coupled to a second port of the optical circulator, injects spontaneous emissions at or near the wavelength of a longitudinal mode of the optical signal into the laser cavity via the first port of the optical circulator. A third port on the optical circulator outputs the optical signal with the effective linewidth of said mode increased by said spontaneous emission. The laser cavity can be contained in a ring laser having a first end coupled to a first port and a second end coupled to said third port of the optical circulator. Such apparatus further comprises an optical coupler coupled to the ring laser for outputting the optical signal with the increased effective linewidth.

Another embodiment of the present invention uses a semiconductor laser to output an optical signal. An optical amplifier is coupled in series with an output of the laser for amplifying the optical signal. The amplifier includes means for generating spontaneous emissions at or near the wavelength of a longitudinal mode of the optical signal. The amplifier injects the spontaneous emissions into the laser output. The spontaneous emissions injected into the laser increase the effective linewidth of said mode. Optical filter means can be coupled in series between the laser and the optical amplifier, for selecting at least one property of the spontaneous emissions that are injected into the laser output. For example, the filter means can select the magnitude and spectral properties of the spontaneous emissions.

Another embodiment of the present invention uses a microchip or solid state laser for providing an output signal with a broad linewidth. The laser is responsive to pump energy for outputting an optical signal. Means are provided for generating spontaneous emissions at or near the wavelength of a longitudinal mode of said optical signal. The spontaneous emissions output from the generating means are combined with the pump energy for input to the microchip laser. The spontaneous emissions input to the laser serve to increase the effective linewidth of said mode.

A spontaneous emission source having a high spectral density at a desired wavelength is also provided. The source comprises a guided wave optical path that includes a grating and an active medium. Optical energy is passed across said grating and active medium within the optical path. The optical energy excites the active medium without lasing to output spontaneous emissions from the optical path at a wavelength established by the grating. The grating can reside in the active medium portion of the optical path. In a preferred embodiment, the active medium comprises a rare earth doped portion of the optical fiber. The guided wave optical path is formed either in a semiconductor substrate or in a silica substrate. In an embodiment where the guided wave optical path is formed in a silica substrate, a planar waveguide can be provided.

BRIEF DESCRIPTION OF THE DRAWINGS

FIG. 4 is a block diagram illustrating apparatus in accordance with a fourth embodiment of the present invention that uses a spontaneous emission source in series with a laser cavity to increase linewidth;

FIG. 5 is a block diagram illustrating apparatus in accordance with a fifth embodiment of the present invention that couples a spontaneous emission source to a laser cavity via an optical circulator;

FIG. 8 is a block diagram illustrating apparatus in accordance with an eighth embodiment of the present invention that uses an optical amplifier to inject spontaneous emissions into a semiconductor laser to increase linewidth;

FIG. 9 is a block diagram illustrating apparatus in accordance with a ninth embodiment of the present invention wherein spontaneous emissions are input to a microchip laser to increase linewidth;

DETAILED DESCRIPTION OF THE INVENTION

Figure 1:
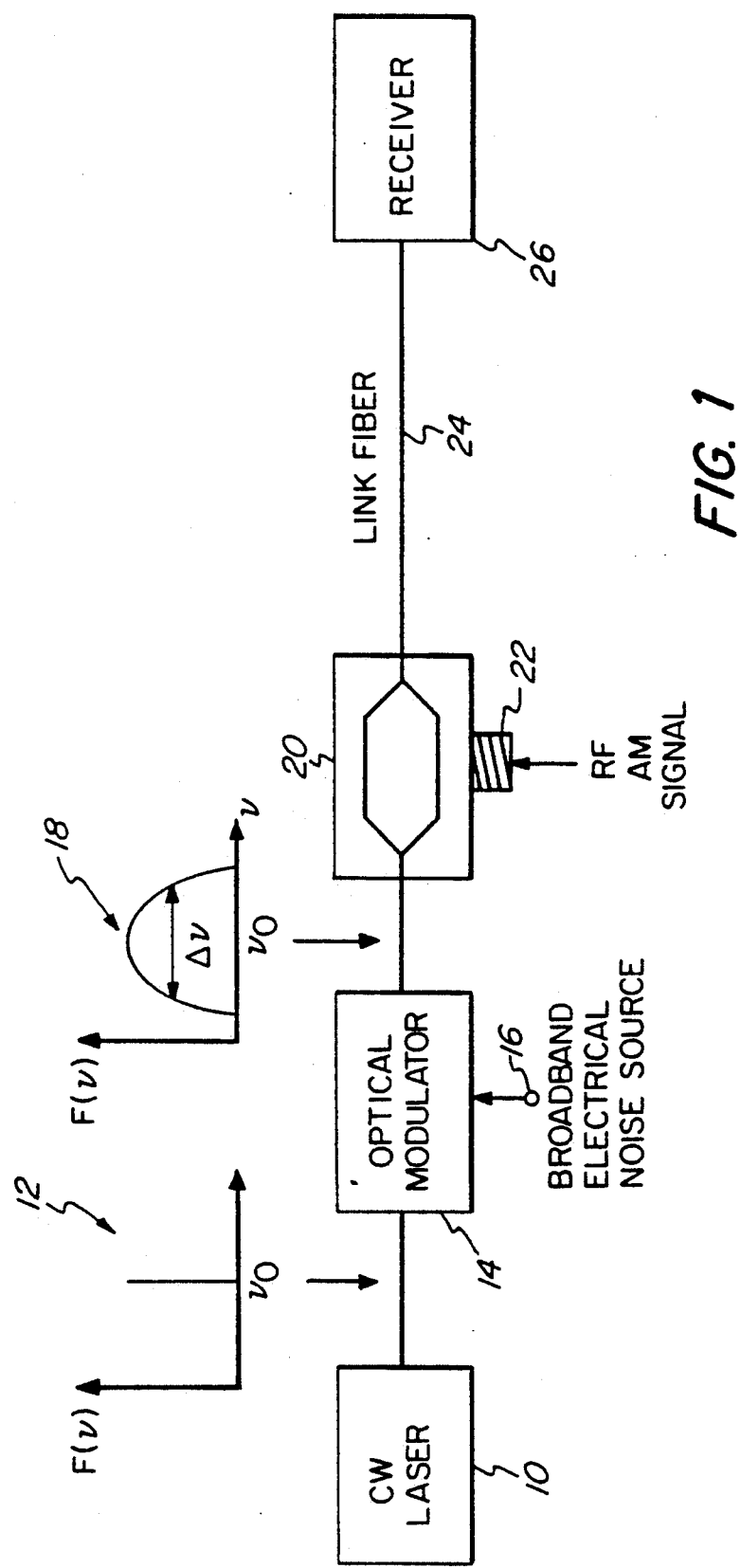
FIG. 1 is a block diagram illustrating apparatus in accordance with a first embodiment of the present invention that uses broadband noise to increase linewidth.

In accordance with the present invention, spontaneous emission sources are provided for use in reducing the non-linear effects exhibited in an optical fiber at high power levels due to the spectral density of the optical signal. The nonlinear effects are reduced to a level enabling the transmission of AM communication signals at relatively high power levels.

Currently, a high power solid state or semiconductor laser for use in communications will produce a signal on the order of 30 milliwatts or so. The output powers of such lasers are increasing at a rapid pace, and output powers on the order of four watts or so are expected to become commercial in the future. It is expected that even higher power lasers will be available for communication purposes in the not too distant future.

High power optical communication systems are advantageous in that a signal can be split into a plurality of paths (e.g., in a tree and branch distribution network). In addition, high power enables the signals to be transmitted over longer distances without the need for signal amplification. This reduces the cost of the communication system. Non-linear effects such as four-wave mixing and Brillouin gain have hampered efforts to provide a cost effective high power optical communication system for AM signals, such as television signals transmitted over a cable television network. In order to overcome the non-linear effects for relatively high power AM signals communicated over an optical fiber, the present invention increases the effective linewidth of the carrier light source (e.g., laser) to reduce the effects of fiber non-linearity. Broadening the optical linewidth reduces the spectral density of the signal, distributing the same power over a broader range.

As an example, the Brillouin gain threshold is reduced by the ratio $\Delta\nu_B/(\Delta\nu_B+\Delta\nu_p)$ where $\Delta\nu_p$ is the optical linewidth (i.e., the linewidth of the optical field that induces the non-linearity) and $\Delta\nu_B$ is the gain bandwidth of the Brillouin gain. For typical single mode fibers, $\Delta\nu_B$ is approximately equal to 100 MHz. For a modulated distributed feedback ("DFB") laser, the effective $\Delta\nu_p$ is on the order of 10 GHz and up. When a CW laser and an external modulator serve as the pump laser, $\Delta\nu_p$ can be as small as a few kilohertz depending on the specific source laser. Thus, a wide range of $\Delta\nu_p$ can exist, depending on the type of laser used.

In practical vestigial sideband AM systems that use external modulators, approximately 95% of the optical power is concentrated within $\Delta\nu_p$ at $\nu_o$, where $\nu_o$ is the optical frequency of the non-linear pump. For a typical single mode fiber having a Brillouin gain bandwidth of about 100 MHz, a laser providing a linewidth of two kHz will produce a gain $\Delta\nu_B/(\Delta\nu_B+\Delta\nu_p) \approx 1$. For a DFB laser having a linewidth of six GHz, the Brillouin gain $\Delta\nu_B/(\Delta\nu_B+\Delta\nu_p) = 0.016$. Thus, we see the Brillouin gain is much higher for the laser which has a two kHz linewidth.

Optical broadening can be achieved by an optical angle modulator (e.g., frequency or phase modulation) driven by broadband electrical noise (e.g., white noise having a 100 MHz to 300 MHz bandwidth) or a periodic function (e.g., sine wave) to effectively increase the optical linewidth of a light source. Injection of excess spontaneous emissions into a laser cavity can also be used to broaden the optical linewidth of an output signal. As illustrated in the embodiment shown in FIG. 1, continuous wave laser 10 produces an optical spectrum 12 having an optical frequency $\nu_o$. The narrow linewidth of the laser output signal is increased by modulating it with broadband electrical noise input to an optical modulator 14 at terminal 16. The resultant spectrum 18 output from optical modulator 14 has a substantially increased linewidth $\Delta\nu$. This optical signal, still centered around optical frequency $\nu_o$, serves as an optical carrier for communication of an information signal to a conventional receiver 26 over a link fiber 24.

In order to modulate the optical carrier with the information signal, an external modulator 20 is provided. This modulator can comprise, for example, an electrooptic device such as a Mach Zehnder modulator. External optical modulators are well known in the art. See, e.g., S. E. Miller, T. Li, and E. A. J. Marcatili, "Research Toward Optical Fiber Transmission Systems", Proc. IEEE, Vol. 61, pp. 34-35, Dec. 1973. In the embodiment illustrated in the figure, an RF AM signal, such as an AM VSB television signal, is input to external modulator 20 via coaxial cable input terminal 22. The AM modulated optical carrier is then received by receiver 26 via the link fiber.

Optical modulator 14 can comprise either a phase modulator or a frequency modulator. The linewidth of the signal output from modulator 14 is selected by controlling the bandwidth of the electrical noise source and/or the optical modulation index of the optical modulator. Optical phase modulators that can be used in connection with the present invention are commercially available. For example, the Model PM 315 modulator sold by Crystal Technology of Palo Alto, Calif. and the Model IOC 1000 modulator sold by BT&D of Wilmington, Del.

A difficulty in realizing a pure optical phase modulator such as modulator 14 illustrated in the embodiment of FIG. 1, is that if there are any reflections the phase modulator acts as a Fabry Perot interferometer, which introduces unwanted amplitude noise, i.e., relative intensity noise (RIN). It has been recently reported that a lithium niobate modulator can achieve virtually ideal phase modulation. S. K. Korotky, et al., "High-Speed Low Power Optical Modulator with Adjustable Chirp Parameter," *Integrated Photonics Research Conference*, Paper TuG2, April 9-11, 1991, Monterey, Calif. Such a modulator can be used to increase linewidth using a broadband electrical noise source as illustrated in FIG. 1. Alternatively, such a modulator can be used to increase linewidth using a sine wave as illustrated in the embodiment of FIG. 2.

Figure 2:
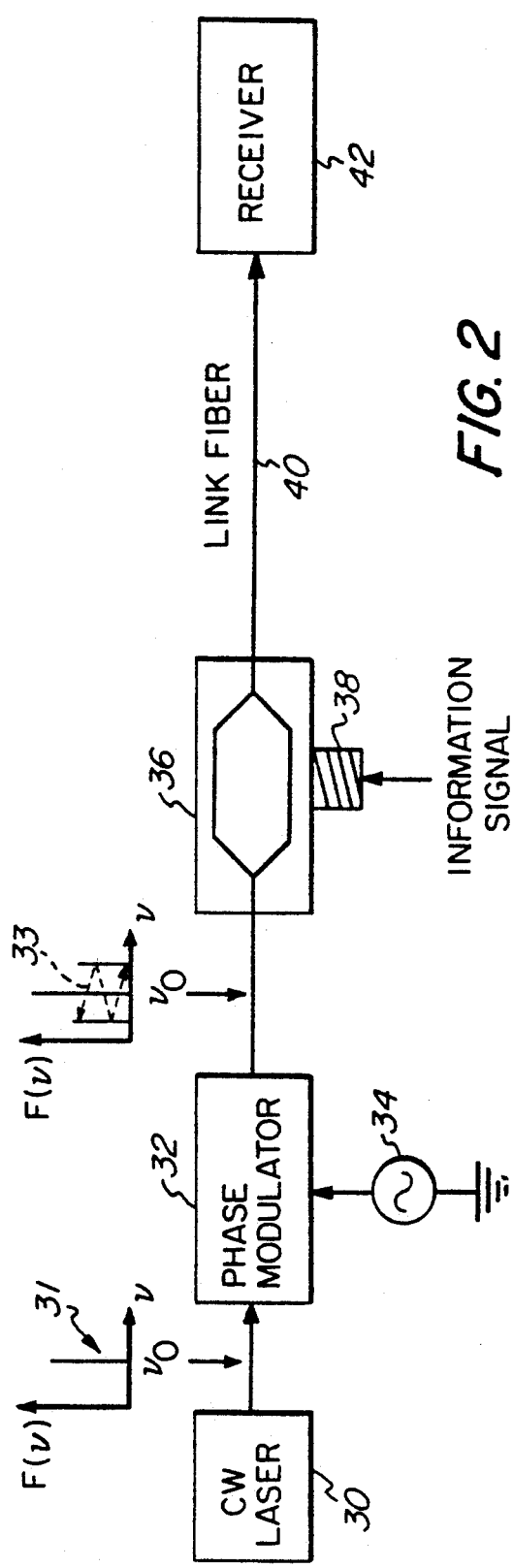
FIG. 2 is a block diagram illustrating apparatus in accordance with a second embodiment of the present invention that uses a periodic function input to an external modulator to increase linewidth.

As illustrated in FIG. 2, a continuous wave laser 30 provides an optical output signal having a longitudinal mode 31 that is modulated in a phase modulator 32 by a periodic function such as a sine wave provided by source 34. By modulating this mode with a sine wave in phase modulator 32, the effective linewidth of mode 31 is increased as illustrated by dotted line 33, to extend between the first sideband components of the sinusoidal modulation. Thus, if the periodic function input to phase modulator 32 is a sine wave, the effective linewidth of the mode 31 will be broadened. Those skilled in the art will appreciate that the actual width of mode 31 remains narrow, but its effective linewidth is increased by the frequency dithering caused by the sinusoidal modulation.

The output 33 of phase modulator 32 is coupled to an external modulator 36 that is the same as modulator 20 described in connection with FIG. 1. An information signal input to the external modulator modulates the optical signal for transmission, of the information via link fiber 40 to a receiver 42.

Figure 3:
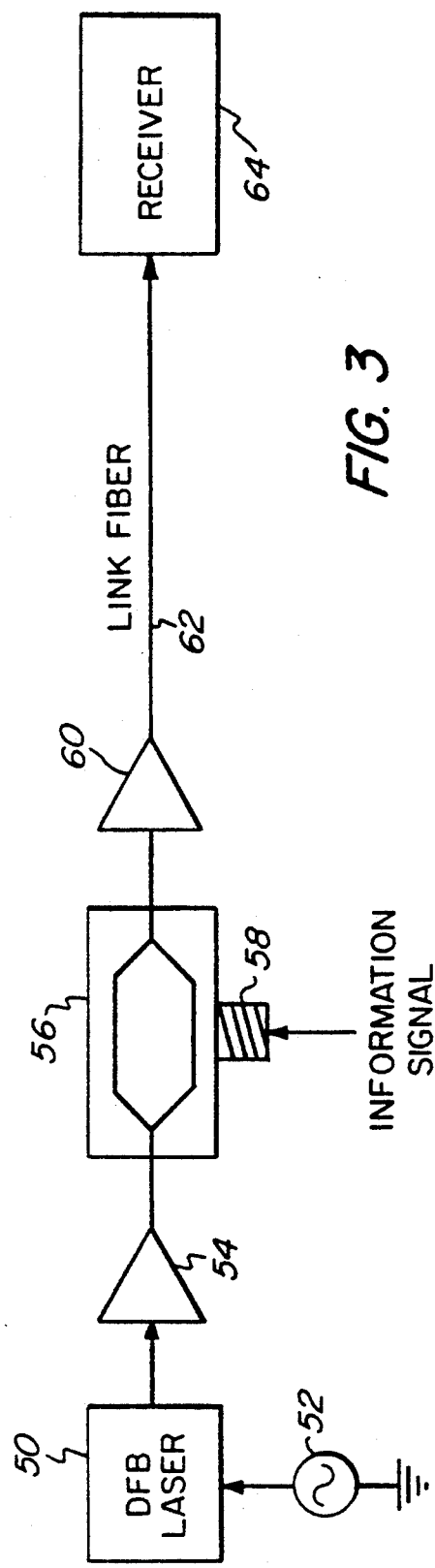
FIG. 3 is a block diagram of a third embodiment of the present invention wherein a periodic function directly modulates a laser to increase linewidth.

FIG. 3 illustrates another embodiment wherein a distributed feedback (DFB) laser 50 is directly modulated with a periodic function, such as a sine wave provided by source 52. The modulation of the DFB laser broadens the optical linewidth and reduces the source coherence. For providing an optical carrier for cable television applications, an RF sine wave can be used to directly modulate DFB laser 50. The output of the laser will comprise an optical signal having a longitudinal mode that sweeps back and forth with the sine wave modulation. In other words, the original longitudinal mode of the laser is dithered between bounds established by the frequency of the input periodic function. The effect is that the average linewidth is widened, providing a broadened output signal to reduce the system Brillouin threshold allowing higher power operation. The added advantage of reduced coherence length serves to reduce the susceptibility of the system to beat noise degradation. Beat noise degradation is the interferometric conversion of optical phase noise to intensity noise. In a directly modulated DFB laser, beat noise degradation is manifest in the system as an increase in system relative intensity noise (RIN). In a standard externally modulated VSB-AM system, beat noise degradation is seen as an increase in the phase noise of the RF carriers.

The embodiment of FIG. 3 illustrates optional optical amplifiers 54 and 60, which can be provided at the input and output ends, respectively, of external modulator 56. As in the embodiments illustrated in FIGS. 1 and 2, modulator 56 can comprise a Mach Zehnder type modulator to which an information signal is input via coaxial cable terminal 58. The information is carried via link fiber 62 to a receiver 64 in a conventional manner.

Figure 10:
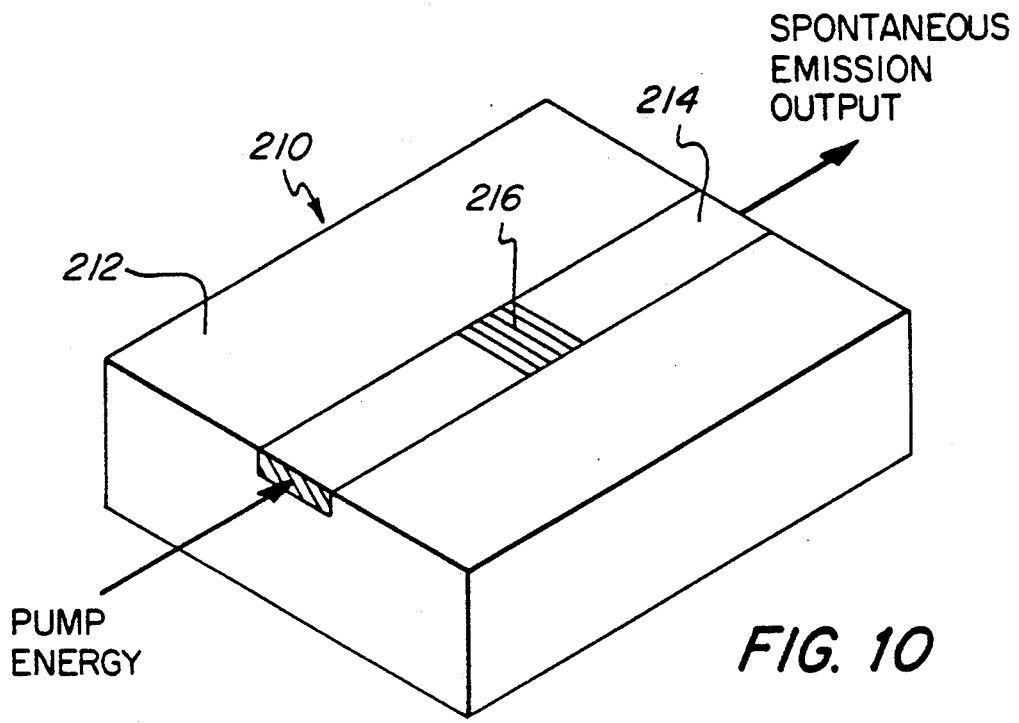
FIG. 10 is a perspective view of a spontaneous emission source formed from a semiconductor substrate in accordance with the present invention.
Figure 11:
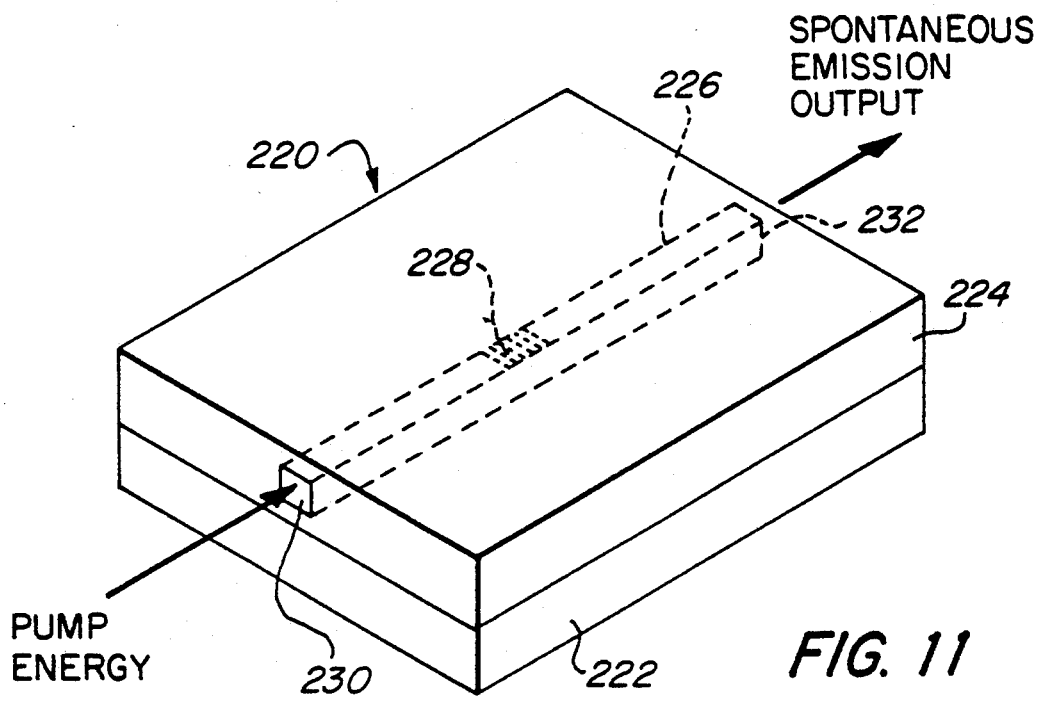
FIG. 11 is a perspective view of a spontaneous emission source formed from a silica substrate in accordance with the present invention.

It is also possible to increase the linewidth of a longitudinal mode by injecting excess spontaneous emission into a laser cavity. Various implementations of such a system are illustrated in FIGS. 4 through 9. Examples of spontaneous emission sources implemented on semiconductor and silica substrates are shown in FIGS. 10 and 11, respectively. The spontaneous emission sources of any of FIGS. 4 through 9 can be replaced with either of the sources illustrated in FIGS. 10 and 11.

FIG. 4 illustrates a linear embodiment wherein an erbium fiber laser linewidth is increased via the injection of excess spontaneous emission into the laser cavity. An active fiber 74 between a grating 72 and an optical isolator 76 generates excess spontaneous emission at or near the lasing wavelength provided by a laser cavity generally designated, 80. The lasing wavelength is determined by grating 78 within the laser cavity. Active fiber 74 does not lase since isolator 76 provides a very low back reflection. Thus, the erbium fiber extending from grating 72 to isolator 76 provides a spontaneous emission source, when pumped by a pump laser 70, for injection of spontaneous emission into laser cavity 80 via isolator 76. Unabsorbed pump power from pump laser 70 also propagates through isolator 76 to excite laser cavity 80. The unabsorbed pump power pumps the erbium fiber laser defined by grating 78 and reflector 84. Although such a design would be most efficient for delivering spontaneous emissions at wavelengths that differ from the lasing wavelength, spontaneous emissions at or near the lasing wavelength (i.e., the wavelength defined by grating 78) can be provided if grating 78 is chosen to have a reflectivity that passes a relatively large amount of the spontaneous emission from the emission source. For example, such a result can be achieved if the reflectivity of grating 78 is on the order of 50% at the lasing wavelength. Mode selection within the laser cavity is provided by conventional means 82, such as the provision of a narrow Fabry Perot within the laser cavity. Specific techniques for mode selection are disclosed in commonly assigned, co-pending U.S. patent application Ser. No. 07/770,762 filed on Oct. 9, 1991 now U.S. Pat. No. 5,151,908 and incorporated herein by reference. After mode selection, the light from laser cavity 80 is passed through an optical isolator 86 for output to an external modulator for the information signal.

In the embodiment of FIG. 5, an optical circulator 100 is used to couple spontaneous emissions into the laser cavity. Unlike the embodiment of FIG. 4, wherein the same pump laser was used for both the spontaneous emission source and the laser cavity, separate pump lasers are provided in the embodiment of FIG. 5. Pump laser 90 is used to excite a fiber laser generally designated 94. A grating 92 is used to set the lasing wavelength, and conventional mode selection components 96 select a desired longitudinal mode. The laser cavity extends between grating 92 and a reflector 98, the output of which is coupled to a first input port 102 of optical circulator 100.

A second pump laser 110 excites an active fiber generally designated 114. A grating 112 selects the wavelength of the spontaneous emission. The spontaneous emissions are input to a second port 104 of optical circulator 100. The spontaneous emissions are coupled via circulator 100 to first port 102, where they are fed back into laser cavity 94 via reflector 98, which passes the spontaneous emission wavelength. The resultant broadened optical signal is output via port 106 of optical circulator 100, to an optical isolator 108. The optical circulator provides an efficient method for coupling spontaneous emission into the laser cavity.

Figure 6:
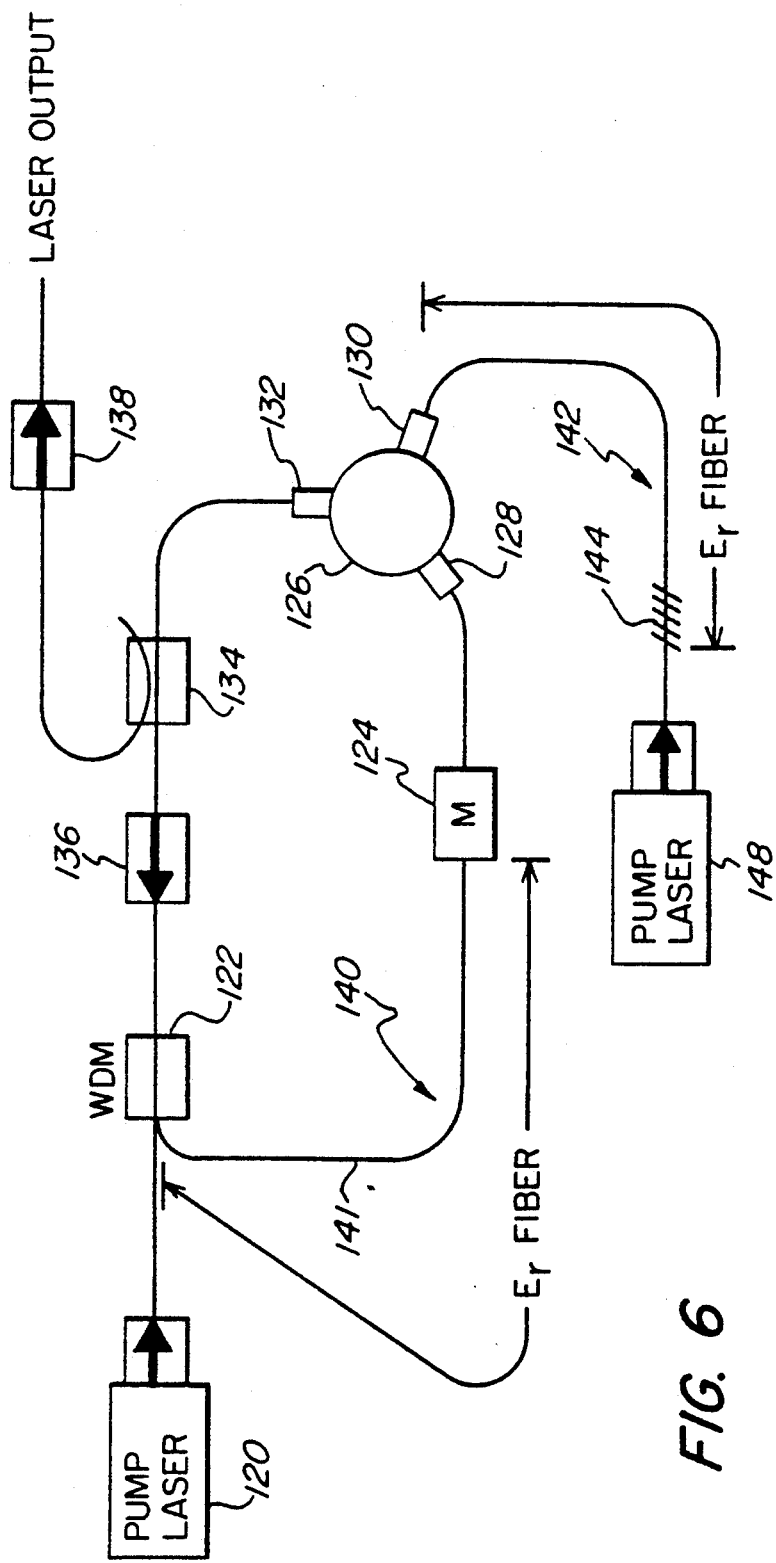
FIG. 6 is a block diagram illustrating apparatus in accordance with a sixth embodiment of the present invention that uses an optical circulator to couple a spontaneous emission source to a ring laser to increase linewidth.

FIG. 6 illustrates an embodiment of the present invention wherein a ring cavity generally designated 140 is used for the laser. Pump laser 120 is provided to excite the laser cavity. The pump energy is coupled to the ring cavity via a wavelength division multiplexer 122. An active laser medium, for example an erbium doped fiber 141, extends between wavelength division multiplexer 122 and a mode selector 124. A spontaneous emission source generally designated 142 comprises a length of erbium fiber having a grating 144 for establishing the wavelength of the spontaneous emission. Pump laser 148 is provided to pump the erbium fiber to produce the spontaneous emission. The output of the spontaneous emission generator is coupled to an optical circulator 126 via port 130. The spontaneous emission is injected into the laser cavity 140 via port 128 of the optical circulator. The resultant laser output signal enters optical circulator 126 via port 128, and outputs the circulator via port 132. An optical coupler 134 is used to output the laser signal via an optical isolator 138. An optical isolator 136 is provided within the laser ring cavity in a conventional manner.

Figure 7:
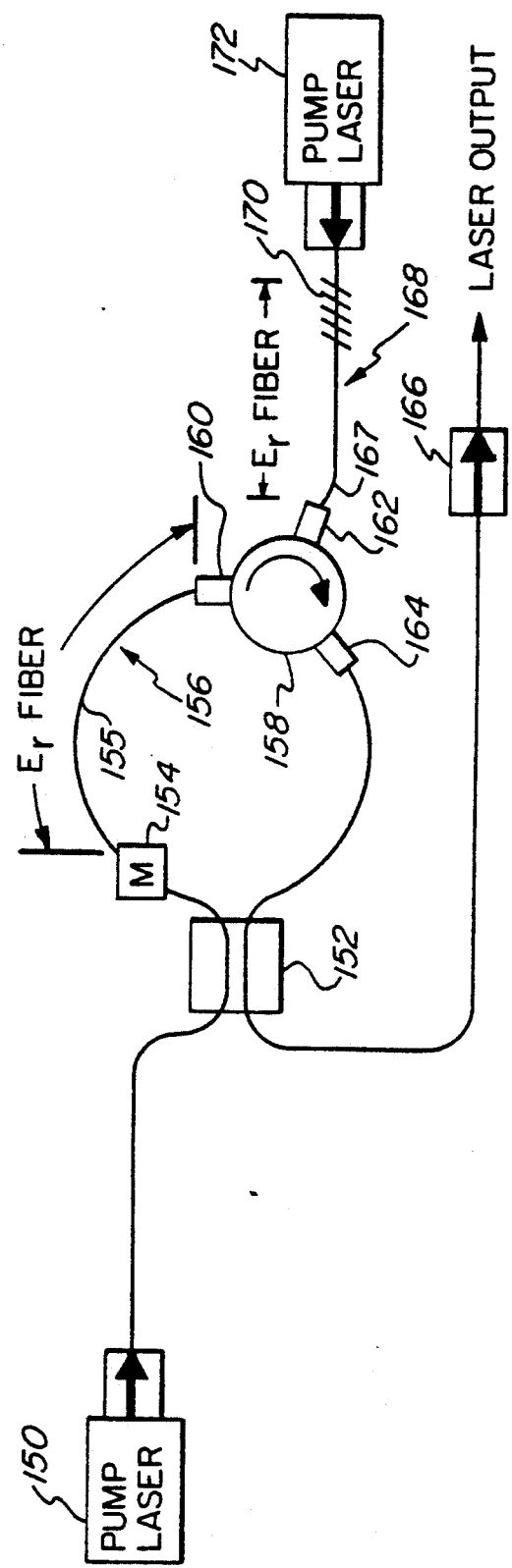
FIG. 7 is a block diagram illustrating apparatus in accordance with a seventh embodiment of the present invention utilizing a different type of ring laser.

Another ring laser configuration is illustrated in FIG. 7. In this embodiment, pump laser 150 pumps the laser cavity 156. Mode selection is provided by conventional components 154. An optical circulator 158 receives spontaneous emissions from source 168 via port 162 The spontaneous emission source includes a pump laser 172, grating 170, and active medium such as an erbium doped fiber 167. Laser cavity 156 includes an active medium such as erbium fiber 155 between the mode selector 154 and optical circulator 158. The optical signal generated by the laser cavity is input to port 160 of circulator 158 for output via port 164, optical coupler 152, and optical isolator 166.

Spontaneous emission can also be used to broaden the linewidth of a semiconductor laser signal. FIG. 8 illustrates an embodiment in accordance with the present invention, wherein spontaneous emission from an optical amplifier 184 is injected into a semiconductor laser 180. In a preferred embodiment, an optional optical filter 182 can be provided to select the magnitude and spectral property of the spontaneous emission fed back into the laser. The injection of spontaneous emission into laser 180 causes a line broadening as described above. The optical signal produced by the laser is output via an optical isolator 186.

Solid state or microchip lasers utilizing rare earth laser systems can also be used in accordance with the present invention. An example of such a system is illustrated in FIG. 9. An erbium microchip laser 196 is co-doped with erbium ytterbium ($Yb^{3+}$) to facilitate pumping by pump laser 190 at 1.06 $\mu$m. The pumping energy is coupled to the microchip laser 196 via a lens 194 in a conventional manner. A spontaneous emission source generally designated 206 includes a pump laser 202, grating 204, and an active medium 205 such as a length of erbium fiber. As in the other embodiments, grating 204 establishes the wavelength of the spontaneous emissions. The spontaneous emissions are coupled to the input of the microchip laser via a wavelength division multiplexer 192.

The wavelength of the microchip laser is controlled by a coating on the chip and the pump laser spot size, in a well known manner. For example, the input surface 195 of the laser can have a coating with high reflectivity at 1.5 $\mu$m and a high transmission at 1.06 $\mu$m. In this example, the coating on the output side 197 of the laser would have a high reflectivity at 1.06 μm and a low reflectivity at 1.5 μm. The broadened mode from laser 196 is output via a lens 198, optical fiber 199, and optical isolator 200.

FIG. 10 illustrates a spontaneous emission source that can be used in accordance with any of FIGS. 4 through 9 to generate the spontaneous emission necessary to broaden the laser output. In this embodiment, an integrated optical approach is used, in which the emission source 210 comprises a semiconductor substrate 212 having a guided wave portion 214 provided therein. A grating 216 in the guided wave portion establishes the wavelength of the spontaneous emissions.

Substrate 212 can comprise, for example, a lithium niobate substrate. Local doping, defined, e.g., by photolithography, is used to form the integrated optical waveguide. The waveguide can be formed from a rare earth material, such as erbium. Ion implantation or indiffusion can be used to dope a surface layer of substrate 212 with the rare earth material, thereby forming a doped integrated guided wave optical path.

FIG. 11 illustrates an alternative embodiment of a spontaneous emission source in which an integrated guided wave optical path 226 is formed in a silica cladding 224 of a silica substrate 222. Waveguide 226 of spontaneous emission source 220 is doped with an active medium, such as a rare earth element. A grating 228 is provided within the optical path formed by the waveguide to establish a wavelength at which spontaneous emissions will be output from the waveguide. The waveguide containing the active medium is pumped at a first end 230, causing spontaneous emission to be output from second end 232. Any conventional pump source, such as a laser, can be used to pump the device. It is noted that other substrates, such as polymers which can be provided, e.g., as polymer films, can be substituted for the silica substrate 222 and/or cladding 224.

Planar waveguides such as those illustrated in FIGS. 10 and 11 can be fabricated using well known techniques. Examples of such techniques are provided in P. Becker, et al, "Erbium-Doped Integrated Optical Amplifiers and Lasers in Lithium Niobate," *Optical Amplifiers and Their Applications*, 1992 Technical Digest Series, Vol. 17, pp. ThB4-4, Jun. 24-26, 1992, Santa Fe, N. Mex. (integrated optical waveguide and semiconductor substrate) and T. Kitagawa, et al, "Amplification in Erbium-Doped Silica-Based Planar Lightwave Circuits," *Optical Amplifiers and Their Applications*, Postdeadline Papers, PD1, pp. 1-4, Jun. 24-26, 1992, Sante Fe, N. Mex. (waveguides fabricated on silica substrates by flame hydrolysis deposition and reactive ion etching).

All of the laser embodiments illustrated in the figures provide output signals with wide optical line widths. These signals can be advantageously used as optical carriers in communication systems, by modulating the signals with an information signal using an external modulator, such as a Mach Zehnder modulator. The wide linewidth sources of the present invention are applicable to any modulation format which suffers from Brillouin gain. It should be appreciated that although erbium laser systems are used in the illustrated embodiments, the inventive concepts may be applied to other laser systems, including but not limited to neodymium systems. The broadened optical signals provided in accordance with the present invention reduce the Brillouin threshold of the communication systems, allowing higher launched power and therefore a greater optical link budget. This advantage is particularly useful in communication systems for cable television applications, using VSB-AM signals.

It should now be appreciated that the present invention provides apparatus and methods for reducing the non-linear effects in link fiber by increasing the optical linewidth of the signal laser. In one illustrated embodiment, the optical linewidth is increased by modulating the laser output with broadband electrical noise using an optical modulator. This spreads the linewidth to reduce the effects of fiber non-linearities. Such non-linearities may include four-wave mixing, Brillouin gain and Raman gain. Other illustrated embodiments utilize a periodic function, such as a sine wave to externally or directly modulate a laser to increase linewidth, or the injection of spontaneous emission into the laser cavity to achieve a broadened optical signal. Various modulation formats will benefit from the broadened linewidth sources, including VSB-AM, FM, PM, and digital systems. The method and apparatus of the present invention are effective for reducing any fiber non-linear effect that depends on the optical spectral density of the pump laser. As a result, higher launch power can be accommodated.

Although the invention has been described in connection with a particular embodiment, those skilled in the art will appreciate that numerous modifications and adaptations may be made thereto without departing from the spirit and scope of the invention as set forth in the claims.

What is claimed is:

1. An optical source for providing an output signal with a broad linewidth comprising:
 a laser for outputting an optical signal having a longitudinal mode;
 a spontaneous emission source for generating spontaneous emissions at or near the wavelength of said longitudinal mode, said spontaneous emission source including:
 an integrated guided wave optical path formed in a semiconductor substrate,
 a grating within said optical path,
 an active medium within said optical path, and
 means for passing optical energy across said grating and active medium within said optical path, said optical energy exciting said active medium without lasing to output spontaneous emissions from said optical path at a wavelength established by said grating; and
 means external of said laser for inputting spontaneous emissions output from said spontaneous emission source to said laser;
 wherein the spontaneous emissions input to said laser increase the effective linewidth of said mode.

2. An optical source in accordance with claim 1 wherein said grating is in the active medium portion of said optical path.

3. An optical source in accordance with claim 2 wherein said active medium comprises a rare earth doped portion of said semiconductor substrate.

4. An optical source in accordance with claim 1 wherein said active medium comprises a rare earth doped portion of said semiconductor substrate.

5. An optical source in accordance with claim 1 wherein:
 said laser is responsive to pump energy for outputting said optical signal; and said means external f said laser combine the spontaneous emissions with said pump energy for input to said laser.

6. An optical source for providing an output signal with a broad linewidth comprising:
   a laser for outputting an optical signal;
   a spontaneous emission source for generating spontaneous emissions at or near the wavelength of a longitudinal mode of said optical signal, said spontaneous emission source including:
     an integrated guided wave optical path formed in a substrate,
     a grating within said optical path,
     an active medium within said optical path, and
     means for passing optical energy across said grating and active medium within said optical path, said optical energy exciting said active medium without lasing to output spontaneous emissions from said optical path at a wavelength established by said grating; and
   means external of said laser for inputting spontaneous emissions output from said spontaneous emission source to said laser;
   wherein the spontaneous emissions input to said laser increase the effective linewidth of said mode.

7. An optical source in accordance with claim 6 wherein said grating is in the active medium portion of said optical path.

8. An optical source in accordance with claim 7 wherein said active medium comprises a rare earth doped portion of said substrate.

9. An optical source in accordance with claim 8 wherein said guided wave optical path comprises a planar waveguide.

10. An optical source in accordance with claim 7 wherein said guided wave optical path comprises a planar waveguide.

11. An optical source in accordance with claim 6 wherein said active medium comprises a rare earth doped portion of said substrate.

12. An optical source in accordance with claim 11 wherein said guided wave optical path comprises a planar waveguide.

13. An optical source in accordance with claim 6 wherein said guided wave optical path comprises a planar waveguide.

14. An optical source in accordance with claim 6 wherein said substrate is a silica substrate.

15. An optical source in accordance with claim 6 wherein said substrate is a polymer substrate.

16. An optical source in accordance with claim 6 wherein:
   said laser is responsive to pump energy for outputting said optical signal; and
   said means external of said laser combine the spontaneous emissions with said pump energy for input to said laser.

* * * * *